(12) United States Patent
Täuber (10) Patent No.: US 6,992,940 B1
(45) Date of Patent: Jan. 31, 2006

(54) SEMICONDUCTOR MEMORY APPARATUS WITH VARIABLE CONTACT CONNECTIONS, AND A CORRESPONDING SEMICONDUCTOR APPARATUS

(75) Inventor: Andreas Täuber, Unterschleißheim (DE)

(73) Assignee: Infineon Technologies AG, Munich (DE)

( * ) Notice: Subject to any disclaimer, the term of this patent is extended or adjusted under 35 U.S.C. 154(b) by 134 days.

(21) Appl. No.: 10/646,166

(22) Filed: Aug. 22, 2003

(30) Foreign Application Priority Data

Aug. 23, 2002 (DE) .......................... 102 38 812

(51) Int. Cl.
*G11C 7/00* (2006.01)

(52) U.S. Cl. .................. 365/202; 365/212; 365/191
(58) Field of Classification Search ............... 365/202, 365/191, 208, 212; 257/679
See application file for complete search history.

(56) References Cited

U.S. PATENT DOCUMENTS

| 5,469,334 A | * | 11/1995 | Balakrishnan ............. 257/924 |
| 5,473,198 A | | 12/1995 | Hagiya et al. |
| 5,502,621 A | | 3/1996 | Schumacher et al. |
| 5,821,614 A | * | 10/1998 | Hashimoto et al. ......... 257/679 |
| 6,127,883 A | * | 10/2000 | Mori et al. .......... 257/E23.079 |

FOREIGN PATENT DOCUMENTS

DE   197 56 529 A1   12/1997

* cited by examiner

*Primary Examiner*—Thong Q. Le
(74) *Attorney, Agent, or Firm*—Fish & Richardson P.C.

(57) ABSTRACT

The invention relates to a semiconductor memory apparatus in which the connections of the connecting contacts can be varied. The invention also relates to a semiconductor apparatus which comprises at least two semiconductor memory apparatuses according to the invention.

20 Claims, 6 Drawing Sheets

| M1_int | M2_int | M3_int | S_OUT |
|--------|--------|--------|-------|
| 0 | 0 | 0 | S |
| 0 | 0 | 1 | S_R |
| 0 | 1 | 1 | S_Rr |
| 1 | 1 | 1 | S_Q |

SEMICONDUCTOR MEMORY APPARATUS WITH VARIABLE CONTACT CONNECTIONS, AND A CORRESPONDING SEMICONDUCTOR APPARATUS

FIELD OF INVENTION

The present invention relates to a semiconductor memory apparatus and to a semiconductor apparatus.

PRIORITY OF OTHER APPLICATIONS

This application claims priority from German Patent Application No. 102 38 812.1-33, filed Aug. 23, 2002, and entitled SEMICONDUCTOR MEMORY APPARATUS WITH VARIABLE CONTACT CONNECTIONS, AND A CORRESPONDING SEMICONDUCTOR APPARATUS.

BACKGROUND

Semiconductor memory apparatuses are known which have contacts in the form of ball grid arrays (BGA) in order to make contact with a printed circuit board. It is also known for semiconductor memory apparatuses to be fitted to a printed circuit board, symmetrically with respect to one another on two sides of the printed circuit board, by means of what is referred to as clamp shelling. This makes it possible for two or more semiconductor memory apparatuses to use one line on the printed circuit board jointly. For this purpose, the connections of the contacts of the two semiconductor memory apparatuses must, however, have mirror-image symmetry with respect to one another. When there are a large number of pins which cannot be interchanged, for example address pins or command pins, this leads to semiconductor memory apparatuses which have a very large number of contacts, in which a large proportion of the contacts cannot be used and are provided only for symmetry purposes.

SUMMARY

One object of the present invention is thus to provide a semiconductor memory apparatus and a semiconductor apparatus which allow advantageous utilization of the available resources, and simple handling of the semiconductor memory apparatus.

According to the invention, a semiconductor memory apparatus or a memory chip is produced, comprising an integrated semiconductor memory and a connecting apparatus and a package, with the connecting apparatus comprising:
  a large number of contacts which are arranged like a matrix and by means of which the semiconductor memory apparatus can be connected to a printed circuit board device or board, which is in particular to be populated, for signaling purposes, or signal connections the large number of contacts comprising a first contact group whose connections or signal connections cannot be varied, a second contact group whose connections or signal connections can be varied, and an allocation contact or mirror pin for receiving an external allocation signaling or mirror signal; and
the integrated semiconductor memory comprising:
  a large number of internal connections, with the large number of internal connections comprising a first group of internal connections whose connections are associated with contacts in the first contact group of the connecting apparatus and are connected to them for signaling purposes, and a second group of internal connections whose connections can be connected to different contacts in the second contact group of the connecting apparatus for signaling purposes,
  an allocation connection which is connected to the allocation contact of the connecting apparatus for signaling purposes,
  a signal producing device which is connected to the allocation connection for signaling purposes and is designed to produce an internal allocation signal which can assume at least two different states, depending on the external allocation signal which is received via the allocation contact,
  an allocation device, remapping unit or steering unit, which is arranged between the second group of internal connections and the second contact group of the connecting apparatus and is connected to them and to the signal producing device for signaling purposes, with the allocation device being designed to carry out an allocation process between the internal connections in the second group and the contacts in the second contact group of the connecting apparatus by producing electrical signal connections between them as a function of the internal allocation signal which is produced by the signal producing device.

In this case, the silicon chip, or what is referred to as the die, on which integrated circuits are formed, is considered as the integrated semiconductor memory as such. The connecting apparatus is used for fitting the semiconductor memory to a printed circuit board device. In this case, signal connections are formed between the semiconductor memory and the contacts, which are arranged like a matrix, of the connecting apparatus.

In the present document, the expression "the connections" of the contacts means that a specific type of signal or a specific signal is transmitted via the respective contact. The connections cannot be changed when there is a fixed association between the internal connections of the semiconductor memory and the respective contacts of the connecting apparatus. In contrast, the connections can be changed when there is no fixed association between the internal connections of the semiconductor memory and the contacts of the connecting apparatus, that is to say, for example, the connections of two contacts can be interchanged internally. The allocation process is not carried out until operation of the semiconductor apparatus begins. The invention makes this possible by connecting the allocation device in between.

One and the same semiconductor memory apparatus may therefore be provided with different contact connections by suitable connection of the allocation device. During the production process, all that is thus required is to produce one type of semiconductor memory, in which different signals can be applied to the contacts as required. There is no need for the connections of the contacts of the semiconductor memory apparatus to be symmetrical with respect to one of the center axes of the semiconductor memory apparatus. The size of the semiconductor memory apparatus can thus be reduced since there is virtually no longer any need to provide unused contacts, which were required for symmetry purposes.

The integrated semiconductor memory preferably furthermore comprises a large number of external connections which are connected to the contacts in the connecting apparatus in a nonvariable manner for signaling purposes, the internal connections in the first group of internal connections are connected to the respective external connections for signaling purposes, and the internal connections in the second group of internal connections can be connected via the allocation device to the respective external connections for signaling purposes.

It is thus possible to vary the connections of some of the external connections. The change to the connections is made within the integrated semiconductor memory.

The large number of external connections are preferably arranged in at least one row, preferably essentially centrally, on the integrated semiconductor memory.

Furthermore and preferably, the second group of internal connections comprises connections, which it should be possible to access quickly, preferably addressing connections, clock connections and/or command connections.

The contacts of the connecting apparatus, which are connected to connections of this type, must each be provided at a specific position with respect to the printed circuit board device to which the semiconductor memory is attached. The semiconductor memory apparatus according to the invention thus makes it possible to connect connections of this type to the respectively required contacts.

In one preferred embodiment, the signal producing device is designed to produce an internal allocation signal with two different states, in which when the internal allocation signal assumes the first state, the connections of the contacts in the second contact group of the connecting apparatus assume a first connection state which can be predetermined, and when the internal allocation signal assumes the second state, the connections of the contacts in the second contact group of the connecting apparatus correspond essentially to the first connections, reflected along the longitudinal center axis or transverse center axis of the semiconductor memory apparatus.

It is thus possible to produce semiconductor memory apparatuses in which the contacts of the connecting apparatus are connected to have at least partial mirror-image symmetry with respect to one another. This therefore means that it is possible to produce just one type of semiconductor memory apparatus, but to achieve different connections between the contacts of the connecting apparatus during the fitting of the semiconductor memory apparatus, so that it is only necessary to use one type of semiconductor memory apparatus. This also makes it possible to reduce the scrap rate of populated printed circuit boards.

In a further preferred embodiment, the signal producing device is designed to produce an internal allocation signal with three different states, and when the internal allocation signal assumes the third state, the connections of the contacts in the second contact group of the connecting apparatus correspond essentially to the first connections, reflected along the other center axis of the semiconductor memory apparatus as in the second state.

In a further preferred embodiment, the signal producing device is designed to produce an internal allocation signal with four different states, and when the internal allocation signal assumes the fourth state, the connections of the contacts in the second contact group of the connecting apparatus essentially correspond to the first connections, reflected along the longitudinal center axis and the transverse center axis of the semiconductor memory apparatus.

The contacts of the connecting apparatus are preferably in the form of a ball grid array.

The allocation device preferably comprises logic gates.

Furthermore, the contacts in the second contact group are preferably arranged essentially symmetrically with respect to the longitudinal center axis and/or transverse center axis of the semiconductor memory apparatus.

The signals to be transmitted between the internal connections of the integrated semiconductor memory and the contacts of the connecting apparatus are preferably not changed significantly by the transmission process. However, the signals can be processed, for example amplified.

Furthermore, according to the invention, a semiconductor apparatus is provided, comprising at least two semiconductor memory apparatuses according to the present invention or a preferred embodiment thereof and a printed circuit board device, in which the two semiconductor memory apparatuses are arranged essentially opposite one another on opposite sides of the printed circuit board device, and the printed circuit board device comprises at least one allocation supply connection which can be connected to the allocation contact of one semiconductor memory apparatus for signaling purposes.

The semiconductor apparatus is preferably designed such that, during operation of the semiconductor apparatus, the allocation contact of the first semiconductor memory apparatus is not connected to the printed circuit board device for signaling purposes, and the internal allocation signal of the first semiconductor memory apparatus assumes the first state, and the allocation contact of the second semiconductor memory apparatus is connected to a predetermined allocation supply connection of the printed circuit board device for signaling purposes, and the internal allocation signal of the second semiconductor memory apparatus assumes the second state.

This makes it possible to use two semiconductor apparatuses, whose production processes are identical, in a clamp shell arrangement with a printed circuit board device.

During the process of populating the printed circuit board device, the first semiconductor memory apparatus is arranged and mounted in the "correct orientation" on the first side of the printed circuit board device. When the semiconductor memory apparatus is being fitted, the contacts of the semiconductor memory apparatus must be arranged to be coincident with the connections of the printed circuit board device. However, in this case, it is possible to arrange the semiconductor memory apparatus "the right way round", that is to say in the correct orientation, or "the wrong way round" or "upside down", that is to say in the incorrect orientation. Semiconductor memory apparatuses generally have a marking in order to ensure the correct orientation.

In this case, the allocation contact of the first semiconductor memory apparatus does not make contact with the printed circuit board device; but "floats". The allocation signal of the first semiconductor memory apparatus assumes the first state, and the first connections are used for the contacts of the semiconductor memory apparatus.

The second semiconductor memory apparatus is positioned in the correct orientation on the other side of the printed circuit board device. This means that the allocation supply connection of the printed circuit board device is connected for signaling purposes to the allocation contact of the second semiconductor memory apparatus. The allocation signal of the second semiconductor memory apparatus assumes the second state, with the second contact group now being connected along the longitudinal center axis or transverse center axis of the semiconductor memory apparatus with respect to the connections of the first semiconductor memory apparatus. This allows a clamp shell arrangement.

The printed circuit board device preferably comprises at least two allocation supply connections which can be connected to the allocation contact of one semiconductor memory apparatus for signaling purposes and, depending on the allocation supply connection of the printed circuit board device to which the allocation contact of the second semiconductor memory apparatus is connected for signaling purposes, the internal allocation signal of the second semiconductor memory apparatus assumes the second state or the third state.

In this embodiment, only the first semiconductor memory apparatus need be arranged with the correct orientation with respect to the printed circuit board device. The second semiconductor memory apparatus can be arranged "in the correct orientation" or "incorrectly oriented", that is to say this allows the contacts of the second semiconductor memory apparatus to be connected correctly for both orientations.

In one preferred embodiment, the semiconductor apparatus is designed such that the printed circuit board device comprises at least four allocation supply connections;

the allocation contact of the first and second semiconductor memory apparatus is connected to a respective predetermined allocation supply connection of the printed circuit board device for signaling purposes; and depending on the allocation supply connection of the printed circuit board device to which the allocation contact of the second semiconductor memory apparatus is connected for signaling purposes, the internal allocation signal of the second semiconductor memory apparatus assumes the second state or the third state, and the internal allocation signal of the first semiconductor memory apparatus assumes the first state or the fourth state.

In this embodiment, both semiconductor memory apparatuses can be oriented "as required". In this case, however, the allocation contact of the first semiconductor memory apparatus must also be connected to an allocation supply connection of the printed circuit board device for signaling purposes. The appropriate connections of the contacts of the semiconductor memory apparatus are formed "automatically".

Further objects, features and advantages of the present invention will become evident from the description of an example of one preferred embodiment, with reference to the drawings.

The invention provides a semiconductor memory apparatus in which the connections of at least some of the connecting contacts, or what is referred to as the "pin-out", can be changed during operation. This is carried out internally in the semiconductor memory apparatus, when an appropriate external signal is received.

Preferred embodiments of the semiconductor apparatus 10 according to the invention and of its components will be described in detail in the following text with reference to the figures.

DETAILED DESCRIPTION

Figure 1:
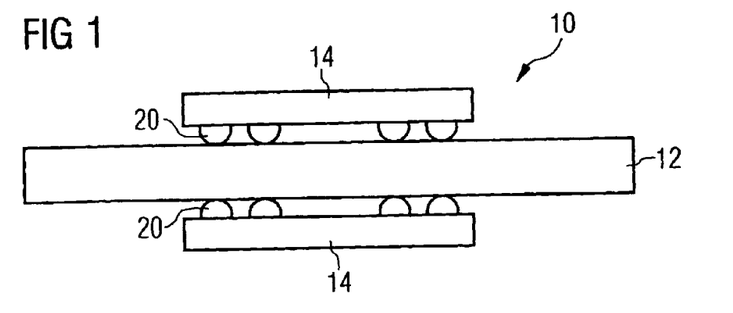
FIG. 1 shows a schematic side view of a semiconductor apparatus according to the invention.

FIG. 1 shows a schematic side view of a semiconductor apparatus 10 according to the invention. The semiconductor apparatus 10 according to the invention comprises a printed circuit board device 12 and at least two semiconductor memory apparatuses 14. One semiconductor memory apparatus 14 is arranged on each side of the printed circuit board device 12, and is connected to it for signaling purposes. The semiconductor memory apparatuses 14 are arranged in what is referred to as a clamp-shell arrangement on the printed circuit board device 12. In this case, the semiconductor memory apparatuses 14 on the first and second sides of the printed circuit board device 12 are essentially symmetrically opposite one another.

The printed circuit board device 12 will be described in more detail with reference to FIGS. 2A and 2B.

Figure 2A:
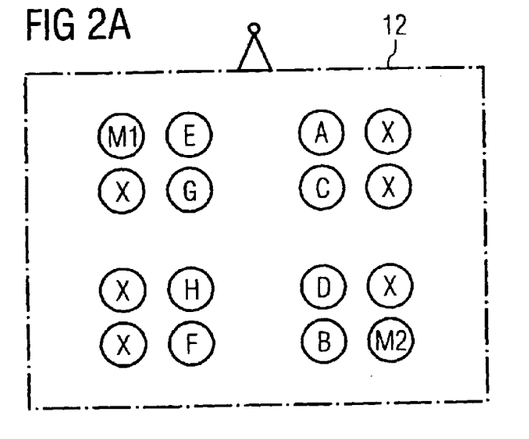
FIGS. 2A and 2B show schematic views of part of the surface faces of a printed circuit board device according to the present invention.
Figure 2B:
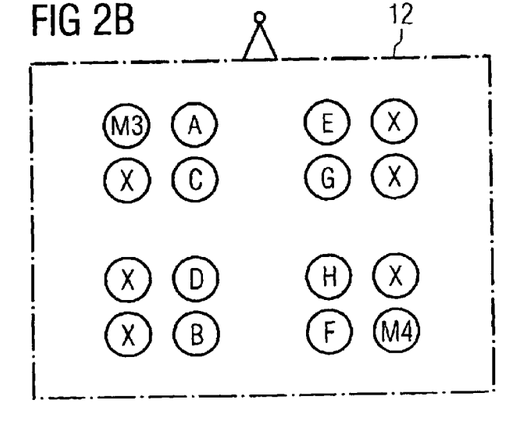

FIGS. 2A and 2B show schematic views of the surface faces of a printed circuit board device according to the present invention. Only a detail of the first side and second side of the printed circuit board device 12 can be seen in each case here. The visible detail is in each case a section of the printed circuit board device 12 on which a semiconductor memory apparatus 14 is intended to be arranged. The black triangle in each case marks the same imaginary edge of the respective section of the printed circuit board device 12.

The points marked with the letters A to H, M1 to M4 and X represent connections or pins on the printed circuit board device 12, to which a semiconductor memory apparatus 14 (which will be described later) can be connected. In this case, the letters denote the pin connections, that is to say which signals should be transmitted via that connection. In this case, the connections A to H are, for example, addressing, command or clock connections. The connections X are, for example, data connections. M1 to M4 are allocation supply connections, by means of which an external allocation signal (which will be described later) is transmitted to the semiconductor memory apparatus 14.

According to the invention, at least one allocation supply connection M1–M4 has to be provided for each two opposite semiconductor memory apparatuses 14.

In the clamp shell arrangement, some lines of the printed circuit board device 12 transmit signals for two semiconductor memory apparatuses 14 which are arranged on respectively opposite sides of the printed circuit board device 12. These are preferably addressing, command or clock signals, which are transmitted via the connections A–H to a connected semiconductor memory apparatus 14. In order to allow reliable operation, the signal paths for these signals should be as identical as possible. It is thus advantageous for the connections A–H to be arranged on the two sides of the printed circuit board device 12 with mirror-image symmetry with respect to one another, with respect to the printed circuit board device 12. A schematic arrangement or schematic connection of the connections on the two sides of the printed circuit board device 12 can be seen, in the form of examples, in FIGS. 2A and 2B.

Figure 3:
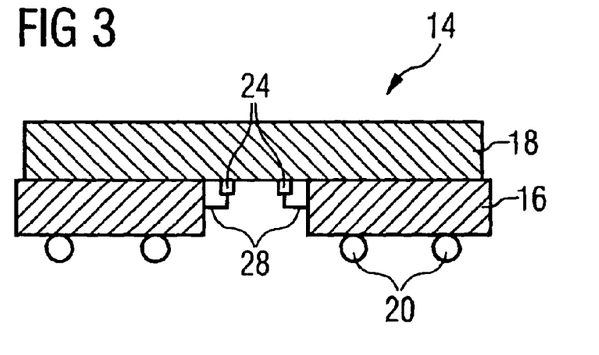
FIG. 3 shows a schematic cross-sectional view of a semiconductor memory apparatus according to the invention.

FIG. 3 shows a preferred embodiment of the semiconductor memory apparatus 14 according to the present invention.

The semiconductor memory apparatus 14 according to the invention comprises a connecting apparatus 16 and an integrated semiconductor memory or silicon chip 18, on which integrated circuits are formed.

The connecting apparatus 16 comprises a large number of contacts 20 by means of which the semiconductor memory apparatus 14 can be attached to a printed circuit board device 12, and via which signals can be transmitted. The contacts 20 are in the form of a matrix or grid, preferably in the form of what is referred to as a ball grid array (BGA), on one surface face of the semiconductor memory apparatus 14. In this case, the contacts 20 are preferably solder points or BGA balls.

Figure 4:
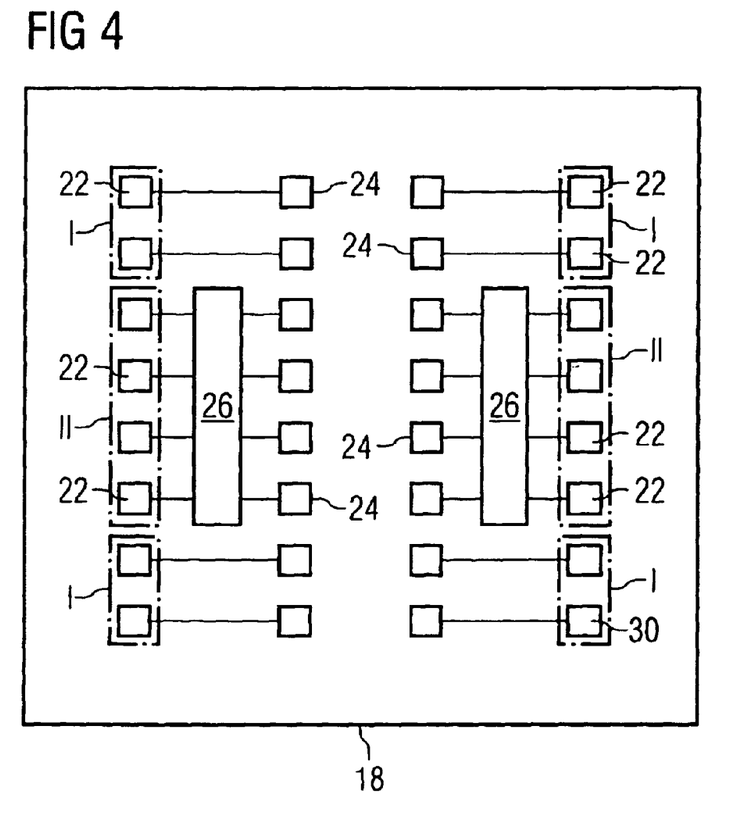
FIG. 4 shows a schematic view of an integrated semiconductor for a semiconductor memory apparatus according to the invention.

FIG. 4 shows a schematic view of an integrated semiconductor memory 18 for a semiconductor memory apparatus 14 according to the invention.

The integrated semiconductor 18 has a large number of internal connections 22 and external connections 24. The internal connections 22 are in this case subdivided into two groups, a first group I and a second group II. The internal connections 22 in the group I are permanently connected to a respective external connection 24 for signaling purposes. In this case, an amplification device, which is not illustrated, can also be provided between the internal connection 22 in the group I and the respective external connection 24. By way of example, this allows the signal to be processed.

According to the present invention, an allocation device 26 is provided between the internal connections 22 in the second group II and the respective external connections 24. The allocation device 26 makes it possible to vary the association between the internal connections 22 in the group II and the respective external connections 24. The method of operation of the allocation device 26 will be described in detail later.

The integrated semiconductor memory 18 furthermore comprises a signal producing device, which is not shown in FIGS. 3 and 4. This makes it possible to use an external allocation signal to produce an internal allocation signal, which is a logical signal with at least two states. The internal allocation signal is supplied to the allocation device 26. The method of operation of the signal producing device will be described in detail later.

One external connection 24 is in the form of an allocation connection 30, which can receive a transmitted external allocation signal and can pass it to the signal producing device. However, two or more external connections 24 may also be provided as the allocation connection 30.

The external connections 24 are connected by means of what are referred to as bonding wires 28 to the connecting apparatus 16, and by internal lines (which are not shown) of the connecting apparatus 16 to the contacts 20, for signaling purposes (FIG. 3).

When a semiconductor memory apparatus 14 is to be fitted to a printed circuit board device 12, the contacts 20 of the connecting apparatus 16 must be connected in such a way as to match the pin connections of the printed circuit board device 12. In this case, the connections for a semiconductor memory apparatus 14 which is to be arranged on the side of the printed circuit board device 12 as shown in FIG. 2A must be different to the connections for a semiconductor memory apparatus 14 which is to be arranged on the side of the printed circuit board device 12 shown in FIG. 2B.

The semiconductor memory apparatus 14 according to the invention makes it possible to vary the connections of at least some of the contacts 20. This is made possible by the allocation device 26, which allows the connections to the external connections 24 to be changed, with these connections 24 in turn being connected to the contacts 20.

FIGS. 5A–5D show schematic views of various connections of the contacts 20 for a connecting apparatus 16 according to the invention. The black triangle in this case in each case marks the same edge of the connecting apparatus 16. The letters in each case denote the connections for the contacts 20, that is to say which signals are intended to be transmitted via the respective contact 20.

Figure 5A:
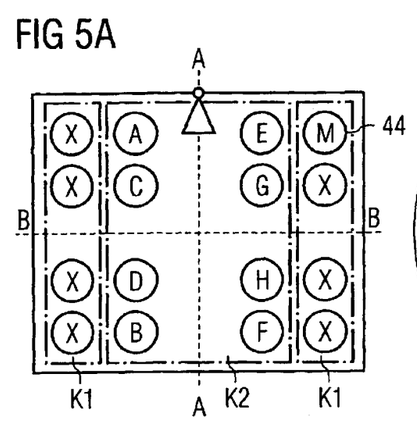
FIGS. 5A–5D show schematic views of the connections of the contacts of a connecting apparatus according to the invention.

In comparison to FIG. 5A, FIGS. 5B–5D show at least partially mirror-image connecting apparatuses 16, corresponding to those in FIG. 5A. For this reason, only the connecting apparatus 16 that is shown in FIG. 5A will be described in detail.

The contacts 20 of the connecting apparatus 16 comprise a first contact group K1 whose connections cannot be varied, and a second contact group K2 whose connections can be varied. The contact group K2 furthermore comprises an allocation contact 44, via which an external allocation signal M_ext can be received by the printed circuit board device 12. The allocation contact 44 is connected for signaling purposes to the allocation connection 30 of the semiconductor memory apparatus 14.

FIG. 5A shows connections which match the pin connections of the printed circuit board device 12 shown in FIG. 2A, when the semiconductor memory apparatus 14 is arranged on the corresponding side of the printed circuit board device 12, and the edges that are marked by black triangles match one another. These connections will be referred to in the following text as the initial connections.

Figure 5B:
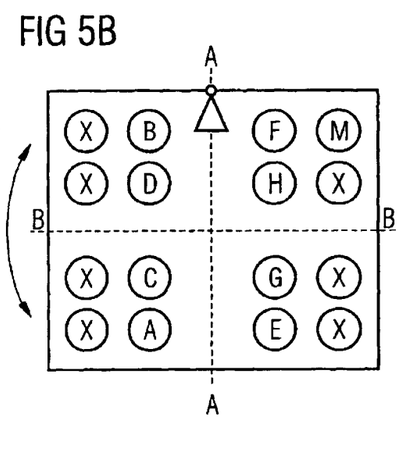
Figure 5C:
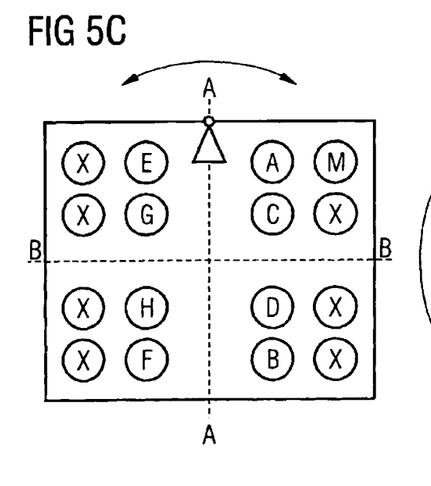

The connections that are shown in FIGS. 5B–5C can be provided by the semiconductor memory apparatus 14 according to the invention when an appropriate allocation signal M_ext is received via the allocation contact 44.

The connections that are shown in FIG. 5C match the connections that are shown in FIG. 2B on the second side of the printed circuit board 12 when the edges that are marked by the black triangles match one another. The connections shown in FIG. 2C, in which the connections of the contacts 20 are annotated A–H, have mirror-image symmetry with respect to the axis A—A for the connections shown in FIG. 2A.

The connections that are shown in FIG. 5B match the connections that are shown in FIG. 2B when the edges that are marked by the black triangles are opposite one another. The connections shown in FIG. 2B, in which the connections of the contacts 20 are annotated A–H, have mirror-image symmetry with respect to the axis B—B for the connections shown in FIG. 2A. This is rotated through 180 degrees with respect to the connections in FIG. 5C.

The following text is based on the assumption that the initial connections as shown in FIG. 5A exist when the semiconductor memory apparatus 14 is not receiving any external allocation signal. However, it is likewise feasible for an external allocation signal to have to be supplied in order to produce connections in this case.

When the semiconductor memory apparatus 14 receives a specific external allocation signal M_ext via the allocation contact 44 that is annotated M, the connections can be changed appropriately.

According to a first embodiment of the present invention, two different ways of connecting the contacts 20 can be provided. These may, for example, firstly be the connections shown in FIG. 5A and the connections shown in FIG. 5B or FIG. 5C, that is to say connections in mirror-image form along the axis A—A or B—B. Two different external allocation signals M_ext are required to do this. In this case, the lack of any signal being supplied or the lack of any contact with the allocation contact 44 is regarded as an external allocation signal.

Figure 6:
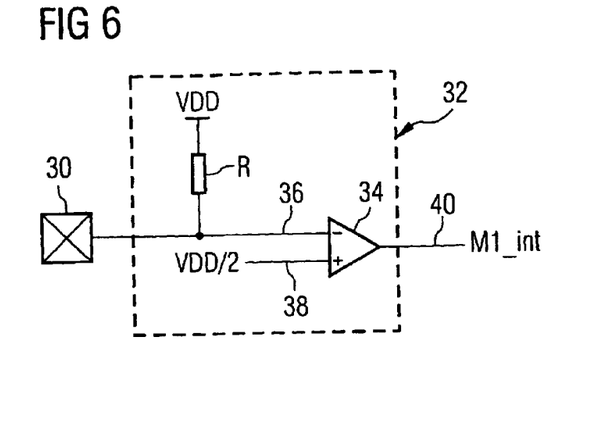
FIG. 6 shows a schematic illustration of a first embodiment of a signal producing device for a semiconductor memory apparatus according to the invention.

FIG. 6 shows a schematic illustration of a first embodiment of a signal producing device 32 for a semiconductor memory apparatus 14 according to the invention.

According to the first embodiment of the present invention, the signal producing device 32 has a resistor R and a comparison device 34. The comparison device 34 comprises a first input 36, a second input 38 and an output 40, at which an internal allocation signal M_int is emitted. The comparison device 34 essentially compares the voltages which are applied to the inputs 36 and 38. If the voltage which is applied to the first input 36 is greater than the voltage which is applied to the second input 38, the logic signal "1" is emitted at the output 40. If, on the other hand, the voltage which is applied to the first input 36 is less than the voltage which is applied to the second input 38, the logic signal "0" is emitted at the output 40.

The first input 36 has a voltage VDD applied to it, which is preferably the supply voltage, via the resistor. Furthermore, the first input 36 is connected to the allocation connection 30, via which the external allocation signal M_ext is transmitted. A voltage VDD/2 is applied to the second input 38.

When no voltage is applied to the allocation connection 30, the input 36 "floats" on the basis of VDD. A "1" is thus emitted as M_int. If a voltage, preferably ground (GND), is transmitted via the allocation connection 30, a "0" is emitted as M_int. M_int is shown as a function of M_ext in the following Table 1.

TABLE 1

| M_ext | M_int |
|-------|-------|
| —     | 1     |
| GND   | 0     |

Figure 7A:
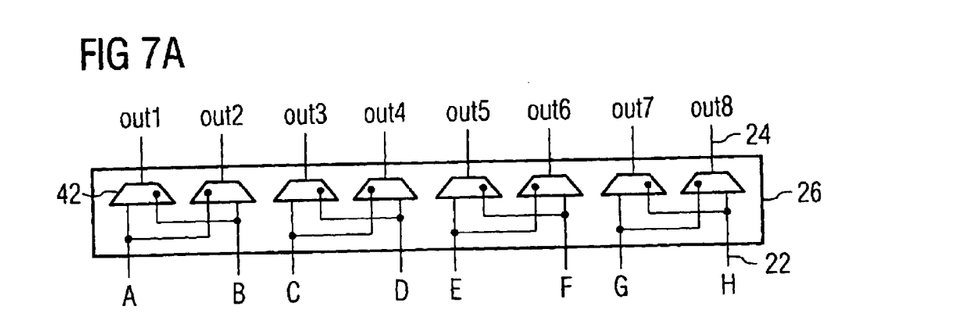
FIG. 7A shows a schematic view of a first embodiment of an allocation device of a semiconductor memory apparatus according to the invention.
Figure 7B:
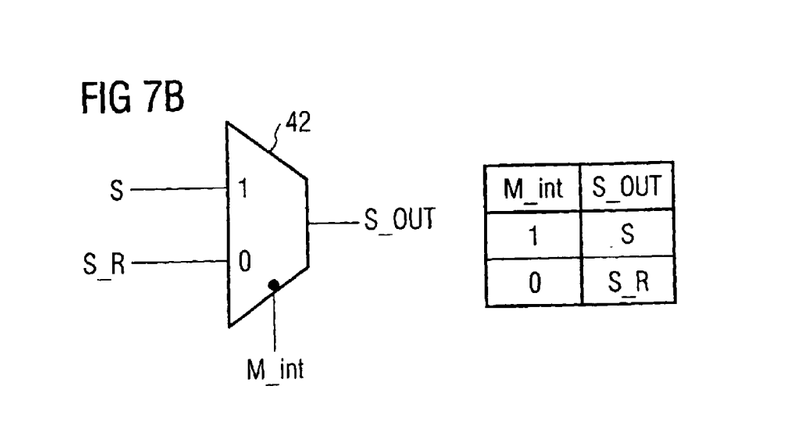
FIG. 7B shows a detailed view of a part of the allocation device shown in FIG. 7A.

FIG. 7A shows a schematic view of a first embodiment of an allocation device 26 for a semiconductor memory apparatus 14 according to the invention. FIG. 7B shows a detailed view of a part of the allocation device 26 shown in FIG. 7A.

The first embodiment of the allocation device 26 comprises a large number of the gates 42, which are illustrated in FIG. 7B. As can be seen from the table in FIG. 7B, the signal "S" which is applied to a first input is emitted when M_int is "1", and the signal "S⁻R" which is applied to a second input is emitted when M_int is "0". This signal "S" may, for example, be a signal for the connections as shown in FIG. 5A. In contrast, the signal "S_R" may be a signal for the connections shown in FIG. 5B or 5C.

As can be seen from FIG. 7A, two internal connections 22 are in each case connected via two gates 42 to two external connections 24. Two signal connections can therefore be interchanged with one another in each case.

As is shown in FIG. 7A, the signal A or B may be emitted, for example, at the external connection 24 which is annotated "out1". The respective other signal, that is to say B or A, is then emitted at the external connection 24 annotated "out2".

This allows the connections shown in FIGS. 5A and 5B to be produced. The connections shown in FIGS. 5A and 5C could be produced by appropriately changing the connections of the internal connections 22.

The process of populating a semiconductor apparatus 10 according to the first embodiment will be described in the following text.

When populating the printed circuit board device 12 with the semiconductor memory apparatuses 14, the first semiconductor memory apparatus 14 on the first side of the printed circuit board device 12 is first of all attached and made contact with. The semiconductor memory apparatuses 14 are in this case oriented correctly with respect to the printed circuit board device 12, that is to say the edges that are marked with black triangles are essentially on top of one another. In this case, the allocation contact 44 for the first semiconductor memory apparatus 14 does not make contact with the printed circuit board device 12. The first semiconductor memory apparatus 14 thus has the initial connections.

The second semiconductor memory apparatus 14 is likewise mounted and made contact with in the correct orientation on the second side of the printed circuit board device 12. In this case, depending on the configuration of the printed circuit board device 12, that is to say depending on whether the allocation supply connection is arranged at M3 or M4, it is possible to use a semiconductor memory apparatus 14 in which the connections are in mirror-image form either about the axis A—A or about B—B as shown in FIG. 5A.

This means that, when the allocation supply connection M3 is present, a semiconductor memory apparatus 14 is preferably used in which the connections can be in mirror-image form about the axis A—A and it is possible to produce the connections as shown in FIG. 5C. In this case, the semiconductor memory apparatus 14 is oriented in such a way that the edges that are marked by the black triangles are located essentially one on top of the other. If, in contrast, the allocation supply connection M4 is present, a semiconductor memory apparatus 14 is preferably used in which the connections may be in mirror-image form about the axis B—B and the connections as shown in FIG. 5B can be produced. In this case, the semiconductor memory apparatus 14 is oriented in such a way that the edges that are marked by the black triangles are essentially opposite one another.

The allocation contact 44 for the second semiconductor memory apparatus 14 makes contact with the allocation supply connection of the printed circuit board device 12. During operation of the semiconductor apparatus 10, a voltage other than VDD, preferably ground (GND), is then produced at the allocation contact 44 of the second semiconductor memory apparatus 14. The semiconductor memory apparatus 14 is thus then connected in a different way to the initial connections.

The process of populating the semiconductor apparatus 10 can thus be simplified considerably. Only one type of semiconductor apparatus 10 need be provided.

According to a second embodiment of the present invention, three different connections can be provided for the contacts 20. By way of example, these are the connections shown in FIGS. 5A–5C.

Figure 8:
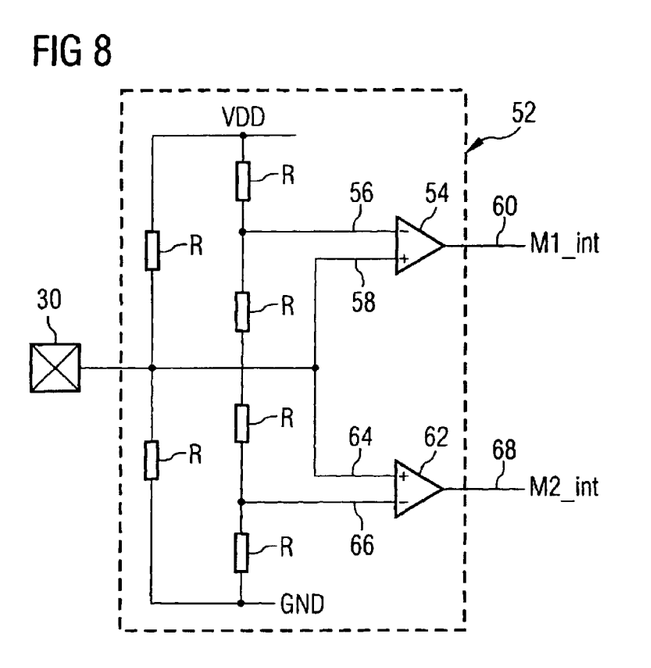
FIG. 8 shows a schematic illustration of a second embodiment of a signal producing device for a semiconductor memory apparatus according to the invention.

FIG. 8 shows a schematic illustration of a signal producing device for the second embodiment of a semiconductor memory apparatus according to the invention.

The signal producing device 52 according to the second embodiment of the present invention comprises six resistors R, a first comparison device 54 and a second comparison device 62. The comparison devices 54 and 62 operate in the same way as the comparison device 34 in the first embodiment. The comparison devices 54 and 62, respectively, have a respective first input 56 and 64, a respective second input 58 and 66, and a respective output 60 and 68 for emitting the respective signal M1_int or M2_int. The internal allocation signal in this embodiment is formed by the two signals M1_int and M2_int.

¾ VDD is applied to the first input 56 of the first comparison device 54. VDD/2 is applied to the second input 58 of the first comparison device 54. Furthermore, this input is connected to the allocation connection 30. A first internal allocation signal M1_int is emitted at the output 60 of the first comparison device 54.

VDD/2 is likewise applied to the first input 64 of the second comparison device 62, and this input is likewise connected to the allocation connection 30. VDD/4 is applied to the second input 66. A second internal allocation signal M2_int is emitted at the output 68 of the second comparison device 62.

If there is no voltage at the allocation connection 30, VDD/2 is applied to the inputs 58 and 64 and a "0" is emitted as M1_int and a "1" is emitted as M2_int. If M_ext is equal to 0, a "0" is emitted as M1_int and a "0" is emitted as M2_int. If M_ext is equal to VDD, a "1" is emitted as M1_int and a "1" is emitted as M2_int. The relationship between M_ext, M1_int and M2_int is shown in Table 2, below:

TABLE 2

| M_ext | M1_int | M2_int |
|---|---|---|
| — | 0 | 1 |
| 0 | 0 | 0 |
| VDD | 1 | 1 |

Figure 9:
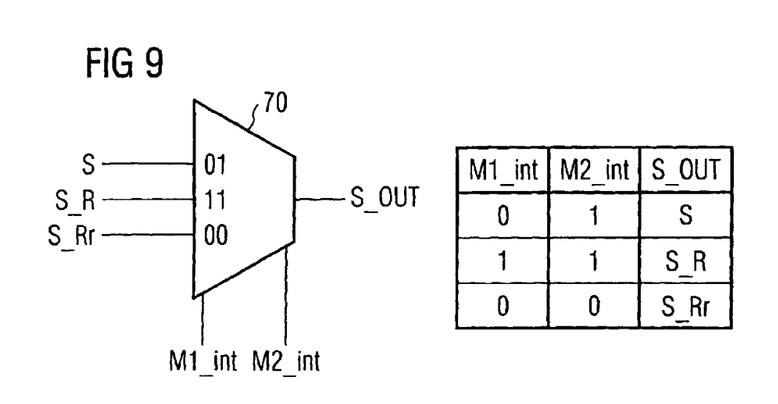
FIG. 9 shows a detailed view of a part of a second embodiment of an allocation device according to the invention.

The second embodiment of the allocation device 26, which is not illustrated, comprises a large number of the gates 70 illustrated in FIG. 9. The gate 70 comprises three inputs and one output. Depending on what is assumed for the values of M1_int and M2_int, one of the three input signals as shown in the table in FIG. 9 is emitted. In the second embodiment of the allocation device 26, three internal connections 22 are in each case connected via three gates 70 to three external connections 24.

As can be seen from the table in FIG. 9, the signal "S" which is applied to a first input is emitted when M1_int is "0" and M2_int is "1", the signal "S_R" which is applied to a second input is emitted when M1_int and M2_int are "1", and the signal "S_Rr" which is applied to a third input is emitted when M1_int and M2_int are "0". The signal "S" may, for example, be a signal for the connections shown in FIG. 5A. In contrast, the signal "S_R" may be a signal for the connections shown in FIG. 5B and the signal "S Rr" may be a signal for the connections shown in FIG. 5C, or vice versa.

The following text describes the process of populating a second embodiment of the semiconductor apparatus 10.

The first semiconductor memory apparatus 14 is arranged, oriented correctly as in the first embodiment, on the first side of the printed circuit board device 12. In this case, the allocation contact 44 of the first semiconductor memory apparatus 14 preferably does not make contact with the printed circuit board device 12, and the first semiconductor memory apparatus 14 thus has the initial connections.

At least two allocation supply connections M3 and M4 are provided on the second side of the printed circuit board device 12 for a second embodiment of the printed circuit board device 12, via each of which different external allocation signals can be transmitted. The two allocation supply connections M3 and M4 are in this case preferably arranged symmetrically about a point with respect to the center of the pin connections of the printed circuit board device 12. The second semiconductor memory apparatus 14 may be arranged in any desired orientation. Depending on the allocation supply connection with which the second semiconductor memory apparatus 14 makes contact, the appropriate connections are provided for the contacts 20 of the second semiconductor memory apparatus 14.

Figure 10:
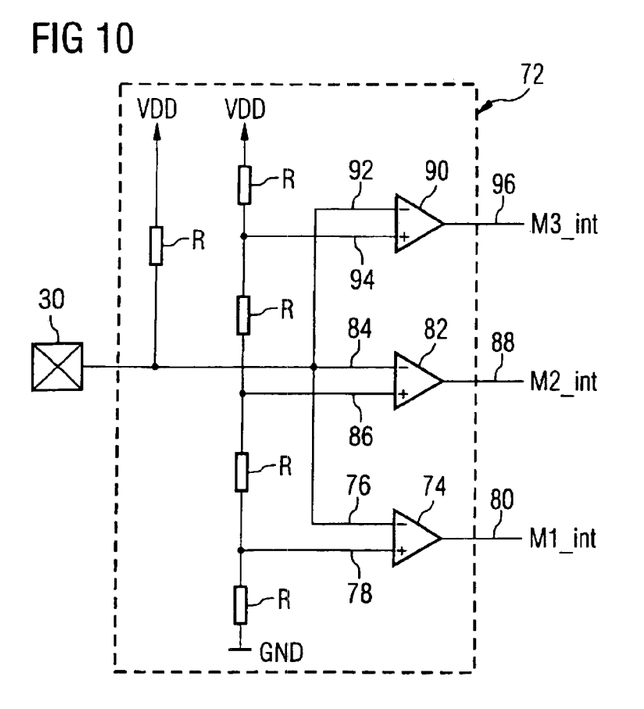
FIG. 10 shows a schematic illustration of a third embodiment of a signal producing device for a semiconductor memory apparatus according to the invention.
Figure 11:
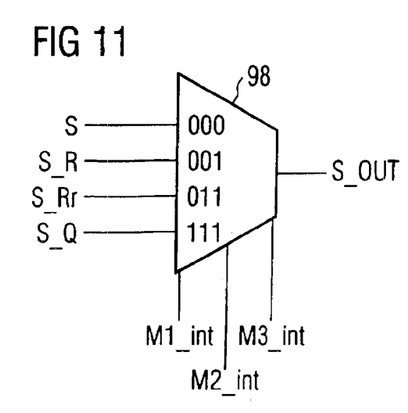
FIG. 11 shows a third embodiment of a voltage divider according to the invention.

FIG. 10 shows a schematic illustration of a signal producing device for the third embodiment of a semiconductor memory apparatus according to the invention.

The third embodiment of the signal producing device 72 according to the present invention comprises five resistors R, a first comparison device 74, a second comparison device 82 and a third comparison device 90. The comparison devices 74, 82 and 90 operate in the same way as the comparison device 34 in the first embodiment. The comparison devices 74, 82 and 90 have a respective first input 76, 84 and 92, a second respective input 78, 86 and 94 and a respective output 80, 88 and 96 for emitting a respective signal M1_int, M2_int or M3_int. The internal allocation signal in this embodiment is formed by the three signals M1_int, M2_int and M3_int.

VDD is applied to the first input 76 of the first comparison device 74. This input is also connected to the allocation connection 30. ¼ VDD is applied to the second input 78 of the first comparison device 74. A first internal allocation signal M1_int is emitted at the output 80 of the first comparison device 74.

VDD is likewise applied to the first input 84 of the second comparison device 82, and the allocation connection 30 is likewise connected to this input. VDD/2 is applied to the second input 86. A second internal allocation signal M2_int is emitted at the output 88 of the second comparison device 82.

VDD is likewise applied to the first input 92 of the third comparison device 90, and this input is likewise connected to the allocation connection 30. ¾ VDD is applied to the second input 94. A third internal allocation signal M3_int is emitted at the output 96 of the third comparison device 90.

When there is no voltage at the allocation connection 30, VDD is applied to the inputs 76, 84 and 92, and a "0" is in each case emitted as M1_int, M2_int and M3_int. If M_ext is equal to ⅝ VDD, a "0" is emitted as M1_int and M2_int, and a "1" is emitted as M3_int. If M_ext is equal to 3/B VDD, a "0" is emitted as M1_int and a "1" is emitted as M2_int and M3_int. If M_ext is equal to the ground signal (GND), a "1" is in each case emitted as M1_int, M2_int and M3_int. The relationship between M_ext, M1_int, M2_int and M3_int is illustrated in Table 3 below.

TABLE 3

| M_ext | M1_int | M2_int | M3_int |
|---|---|---|---|
| — | 0 | 0 | 0 |
| ⅝ VDD | 0 | 0 | 1 |
| ⅜ VDD | 0 | 1 | 1 |
| GND | 1 | 1 | 1 |

Figure 12:
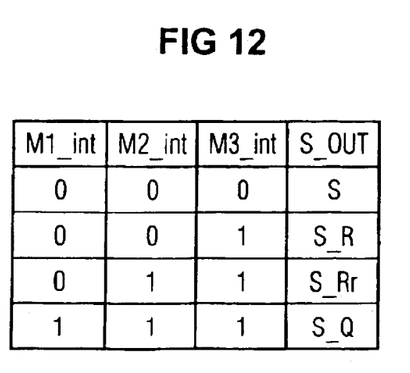
FIG. 12 shows a detailed view of a part of a third embodiment of an allocation device according to the invention.

The third embodiment of the allocation device 26, which is not illustrated, comprises a large number of the gates 98 illustrated in FIG. 12. The gate 98 comprises four inputs and one output. Depending on what is assumed for the values of M1_int, M2_int and M3_int, one of the three input signals is emitted as shown in the table in FIG. 12. In the case of the third embodiment of the allocation device 26, four internal connections 22 are in each case connected via three gates 98 to four external connections 24.

As can be seen from the table in FIG. 12, the signal "S" which is applied to a first input is emitted when M1_int, M2_int and M3_int are "0", the signal "S_R" which is applied to a second input is emitted when M1_int and M2_int are "0" and M3_int is "1", the signal "S⁻Rr" which is applied to a third input is emitted when M1_int is "0" and M2_int and M3_int are "1", and the signal "S⁻Q" which is applied to a fourth input is emitted when M1_int, M2_int and M3_int are "1".

Figure 5D:
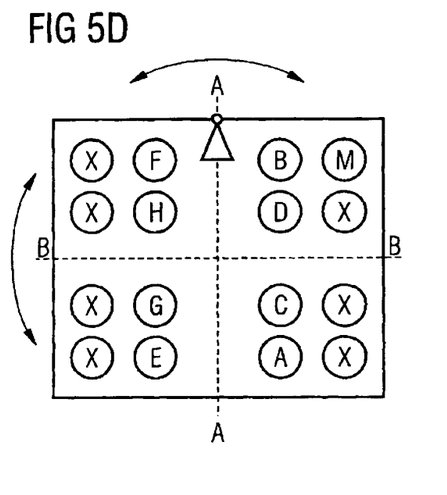

The signal "S" may, for example, be a signal for the connections shown in FIG. 5A, and the signal "S Q" may be a signal for the connections shown in FIG. 5D, or vice versa. In contrast, the signal "S_R" may be a signal for the connections shown in FIG. 5B and the signal "S Rr" may be a signal for the connections shown in FIG. 5C, or vice versa.

| | List of reference symbols |
|---|---|
| 10 | Semiconductor apparatus |
| 12 | Printed circuit board device |
| 14 | Semiconductor memory apparatus |
| 16 | Connecting apparatus |
| 18 | Integrated semiconductor memory |
| 20 | Contacts |
| 22 | Internal connections |
| 24 | External connections |
| 26 | Allocation device |
| 28 | Bonding wire |
| 30 | Allocation connection |
| 32 | Signal producing device |
| 34 | Comparison device |
| 36 | First input |
| 38 | Second input |
| 40 | Output |
| 42 | Gate |
| 44 | Allocation contact |
| 52 | Signal producing device |
| 54 | First comparison device |
| 56 | First input |
| 58 | Second input |
| 60 | Output |
| 62 | Second comparison device |
| 64 | First input |
| 66 | Second input |
| 68 | Output |
| 70 | Gate |
| 72 | Signal producing device |
| 74 | First comparison device |
| 76 | First input |
| 78 | Second input |
| 80 | Output |
| 82 | Second comparison device |
| 84 | First input |
| 86 | Second input |
| 88 | Output |
| 90 | Third comparison device |
| 92 | First input |
| 94 | Second input |
| 96 | Output |
| 98 | Gate |
| A–H, X | Connections |
| M1–M4 | Allocation supply connections |
| R | Resistor |
| M_ext | External allocation signal |
| M_int | Internal allocation signal |
| M1_int | First internal allocation signal |
| M2_int | Second internal allocation signal |
| M3_int | Third internal allocation signal |
| I | First group of internal connections |
| II | Second group of internal connections |
| K1 | First contact group |
| K2 | Second contact group |

What is claimed is:

1. A semiconductor memory apparatus having a first axis and second axis orthogonal to the first axis, the apparatus comprising:
a connector comprising:
contacts arranged in a matrix; the contacts comprising:
a first set of contacts;
a second set of contacts; and
an allocation contact for receiving an external allocation signal; and
an integrated semiconductor memory comprising:
internal connections comprising a first set of connections and a second set of connections;
a signal generation device configured to generate an internal allocation signal having at least two states based on the external allocation signal received from the allocation contact; and
an allocation device connecting to the allocation contact and connecting the second set of connections with the second set of contacts, the allocation device is configured to allocate connections between the second set of connections and the second set of contacts based on the internal allocation signal received from the signal generation device.

2. The apparatus of claim 1, wherein the integrated semiconductor memory further comprises external connections, each of the first set of connections connecting to a corresponding one of the external connections, each of the second set of connections configured to connect to a corresponding one of the external connections through the allocation device.

3. The apparatus of claim 2, wherein the external connections are arranged in at least one row, the connections are positioned substantially in a center of the integrated semiconductor memory.

4. The apparatus of claim 1, wherein the second set of connections comprises address connections.

5. The apparatus of claim 1, wherein the second set of connections comprises command connections.

6. The apparatus of claim 1, wherein the at least two states comprise a first state and a second state; wherein when the internal allocation signal is in the first state, connections of the second set of contacts are in a first connection arrangement; and wherein when the internal allocation signal is in the second state, connections of the second set of contacts are symmetrical to the first connection arrangement about the first axis.

7. The apparatus of claim 6, wherein the at least two states comprise a first state and a second state; and wherein when the internal allocation signal is in the second state, connections of the second set of contacts are symmetrical to the first connection arrangement about the second axis.

8. The apparatus of claim 7, wherein the at least two states comprise a third state; and wherein when the internal allocation signal is in the third state, connections of the second set of contacts are symmetrical to the first connection arrangement about the second axis.

9. The apparatus of claim 7, wherein the at least two states comprise a third state;

wherein when the internal allocation signal is in the third state, connections of the second set of contacts are symmetrical to the first connection arrangement about the first axis.

10. The apparatus of claim 8, wherein the at least two states comprise a fourth state; and wherein when the internal allocation signal is in the fourth state, connections of the second set of contacts are symmetrical to the first connection arrangement about the first axis and the second axis.

11. The apparatus of claim 9, wherein the at least two states comprise a fourth state; and wherein when the internal allocation signal is in the fourth state, connections of the second set of contacts are symmetrical to the first connection arrangement about the first axis and the second axis.

12. The apparatus of claim 1, wherein the contacts comprise a ball grid array.

13. The apparatus of claim 1, wherein the allocation device comprises logic gates.

14. The apparatus of claim 1, wherein the second set of contacts are arranged symmetrically with respect to the first axis.

15. The apparatus of claim 1, wherein the second set of contacts are arranged symmetrically with respect to the second axis.

16. The apparatus of claim 1, wherein the signals that are transmitted between the internal connections and the contacts remain substantially unchanged during transmission.

17. A semiconductor memory apparatus system, comprising:

a first semiconductor apparatus and a second semiconductor apparatus, each semiconductor apparatus comprising:

a connector comprising:
contacts arranged in a matrix; the contacts comprising:
a first set of contacts;
a second set of contacts; and
an allocation contact for receiving an external allocation signal; and an integrated semiconductor memory comprising:
internal connections comprising a first set of connections and a second set of connections;
a signal generation device configured to generate an internal allocation signal having at least two states based on the external allocation signal received from the allocation contact; and
an allocation device connecting to the allocation contact and connecting the second set of connections with the second set of contacts, the allocation device is configured to allocate connections between the second set of connections and the second set of contacts based on the internal allocation signal received from the signal generation device; and a printed circuit board having a first side and a second side opposite the first side; the board comprising at least one allocation supply connection configured to be connected to an allocation contact;

wherein the first semiconductor memory apparatus is positioned on the first side and the second semiconductor apparatus is positioned on the second side opposite the first semiconductor memory apparatus.

18. The system of claim 17, wherein the at least two states comprise a first state and a second state;

wherein during operation, the allocation contact of the first semiconductor memory apparatus is not connected to the printed circuit board and the internal allocation signal of the first semiconductor memory apparatus is in the first state; and wherein the allocation contact of the second semiconductor memory apparatus is connected to one of the at least one allocation supply connections of the printed circuit device and the internal allocation signal of the second memory apparatus is in the second state.

19. The system of claim 18, wherein the at least two states comprise a third state; and wherein the at least one allocation supply connections are configured to connect to the allocation contact of one of the semiconductor memory apparatuses, the internal allocation signal of the second semiconductor apparatus is in a second state or a third state based on the allocation supply connection connected to the allocation contact of the second semiconductor supply connection.

20. The system of claim 17, wherein the at least two states comprise a first state, a second state, a third state and a fourth state, wherein the printed circuit board comprises at least four allocation supply connections, each allocation supply contact is connected to a corresponding allocation supply connection, the internal allocation signal of the second semiconductor memory apparatus is in the second or third state and the internal allocation signal of the first semiconductor memory apparatus is in the first or fourth state based on the connection between the allocation supply connection and the allocation contact of the second semiconductor memory.

* * * * *